US 8,864,938 B2

(12) United States Patent
Kim

(10) Patent No.: US 8,864,938 B2
(45) Date of Patent: Oct. 21, 2014

(54) VACUUM PEELING APPARATUS AND METHOD

(75) Inventor: Dong-Sul Kim, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 43 days.

(21) Appl. No.: 13/468,368

(22) Filed: May 10, 2012

(65) Prior Publication Data

US 2013/0133838 A1 May 30, 2013

(30) Foreign Application Priority Data

Nov. 28, 2011 (KR) .................. 10-2011-0125205

(51) Int. Cl.
*B32B 38/10* (2006.01)
*B32B 37/00* (2006.01)

(52) U.S. Cl.
CPC .............. *B32B 37/00* (2013.01); *Y10S 156/924* (2013.01); *Y10S 156/937* (2013.01)
USPC ............ 156/707; 156/758; 156/924; 156/937

(58) Field of Classification Search
CPC ...................................... B32B 37/00
USPC .................. 156/707, 758, 924, 937
See application file for complete search history.

(56) References Cited

U.S. PATENT DOCUMENTS

| 4,986,890 | A | * | 1/1991 | Setoyama et al. ....... 204/298.06 |
| 6,508,885 | B1 | * | 1/2003 | Moslehi et al. ............... 118/728 |
| 6,749,713 | B2 | * | 6/2004 | Mlinar .......................... 156/701 |
| 7,160,410 | B2 | * | 1/2007 | Anker ........................... 156/230 |
| 8,192,578 | B2 | * | 6/2012 | Haji et al. ..................... 156/707 |
| 8,253,919 | B2 | * | 8/2012 | Watanabe ..................... 349/189 |
| 2001/0052387 | A1 | * | 12/2001 | Kiener et al. .............. 156/272.2 |
| 2005/0263251 | A1 | * | 12/2005 | Mizuno ....................... 156/379.6 |
| 2009/0242124 | A1 | * | 10/2009 | Konno et al. ................. 156/344 |
| 2012/0216961 | A1 | * | 8/2012 | Tsai et al. ..................... 156/707 |

FOREIGN PATENT DOCUMENTS

| JP | 11-261244 | 9/1999 |
| JP | 2003-272258 | 9/2003 |
| KR | 10-2011-0087830 | 8/2011 |

* cited by examiner

*Primary Examiner* — Philip Tucker
*Assistant Examiner* — Nickolas Harm
(74) *Attorney, Agent, or Firm* — Robert E. Bushnell, Esq.

(57) ABSTRACT

The invention relates generally to a vacuum peeling apparatus and a vacuum peeling method. The vacuum peeling apparatus may include a chamber, a sealing maintain frame disposed inside the chamber, a first air tube disposed along a bottom end of the sealing maintain frame and configured to be expandable, a peeling prevention panel configured so as to be inserted into a center of the sealing maintain frame, and a second air tube disposed along an end of the peeling prevention panel.

6 Claims, 4 Drawing Sheets

VACUUM PEELING APPARATUS AND METHOD

CLAIM OF PRIORITY

This application makes reference to, incorporates the same herein, and claims all benefits accruing under 35 U.S.C. §119 from an application earlier filed in the Korean Intellectual Property Office on the 28 of Nov. 2011 and there duly assigned Serial No. 10-2011-0125205.

BACKGROUND OF THE INVENTION

1. Field of the Invention

The invention relates generally to a vacuum peeling apparatus and a method thereof. More particularly, the invention relates to a vacuum peeling apparatus for peeling a film using a vacuum pressure and a method for using the same.

2. Description of the Related Art

An organic light emitting element is a flat display device. Such an organic light emitting element may include an anode, a cathode, and at least an organic emission layer interleaved between the anode and the cathode. The organic light emitting element has the advantages of a wide viewing angle and a superior contrast as well as a fast response speed. Due to the advantages of the organic light emitting element, the organic light emitting element has been receiving attention as the next generation display element. The organic light emitting element may further include at least one of organic layers interleaved among a hole injection layer (HIL), a hole transport layer (ETL), and an electron injection layer (EIL) according to whether an emission layer is made of a high molecular organic material or a low molecular organic material besides an organic emission layer.

In such an organic light emitting element, an organic layer is required to be patterned in order to realize full color. A low molecular organic light emitting element may be patterned using a shadow mask, and a high molecular organic light emitting element may be patterned through an ink-jet printing method and a laser induced thermal imaging (LITI) method using laser. The LITI method has merits. For example, the LITI method can pattern a large area of an organic layer. Furthermore, the LITI method can pattern an organic layer with high precision and with high resolution.

The LITI method may include a process for peeling a film. Typically, a film may be peeled off by using a roll or by lifting a tray that fixes the film. Furthermore, a film may be peed off by blowing gas such as nitrogen or air.

In the case of using a roll, a film may be absorbed in a roll or a film may contact a roll through another structure. Accordingly, secondary contamination may be caused by a roll. Furthermore, a complicated system may be required for driving a roll.

In the case of lifting a tray, it is difficult to constantly maintain the same peeling angle. Therefore, it is difficult to maintain uniform quality.

In the case of blowing a gas, such a method is generally used with the lifting method. It is difficult to uniformly control a gas.

The above information disclosed in this Background section is only for enhancement of an understanding of the background of the described technology, and therefore it may contain information that does not form the prior art that is already known in this country to a person of ordinary skill in the art.

SUMMARY OF THE INVENTION

The described technology has been developed in an effort to provide a vacuum peeling apparatus having the advantages of effectively and stably peeling a film using a vacuum.

The described technology has been developed in an effort to provide a vacuum peeling method having the advantages of effectively and stably peeling a film using a vacuum.

An exemplary embodiment of the invention provides a vacuum peeling apparatus. The vacuum peeling apparatus may include a chamber, a sealing maintain frame disposed inside the chamber, a first air tube disposed along a bottom end of the sealing maintain frame and configured to be expandable, a peeling prevention panel configured so as to be inserted into a center of the sealing maintain frame, and a second air tube disposed along an end of the peeling prevention panel.

The second air tube may be expanded after the peeling prevention panel is inserted into the center of the sealing maintain frame.

The sealing maintain frame may be formed in a rectangular frame shape.

The vacuum peeling apparatus may further include a buffer pad attached to a bottom side of the peeling prevention panel.

The vacuum peeling apparatus may further include a driver that lifts and lowers the peeling prevention panel within the interior of the sealing maintain frame.

Another exemplary embodiment of the invention provides a vacuum peeling method. The vacuum peeling method may include preparing a target object, wherein the target object includes a substrate, a first film disposed on a top surface of the substrate, and a second film disposed a bottom surface of the substrate, and an edge of the first film is connected to an edge of the second film, disposing the target object inside a chamber having an atmospheric pressure, pressurizing the connected edge of the first film and the second film of the target object using a sealing maintain frame, pressurizing the first film disposed on a top surface of the target object by inserting a peeling prevention panel into a center of the sealing maintain frame; forming a sealing space surrounded by the target object, the sealing maintain frame, and the peeling prevention panel, changing an inside pressure of the chamber to a vacuum pressure while maintaining an inside pressure of the sealing space as an atmospheric pressure, changing the inside pressure of the sealing space to a vacuum pressure by relieving the sealing space, and separating the first film from the substrate while maintaining the connected edge of the first film and the second film of the target object by lifting the peeling prevention panel.

The vacuum peeling method may further include disposing a first air tube along a bottom end of the sealing maintain frame, wherein the first air tube is expandable, and disposing a second air tube along an end of the peeling prevention panel, wherein the second air tube is expandable.

The sealing space is formed by expanding the first air tube and the second air tube so as to make the first air tube tightly contact the sealing maintain frame and the target object, and so as to make the second air tube tightly contact the sealing maintain frame and the peeling prevention panel.

The sealing space is relieved by contracting the first air tube and the second air tube.

The sealing maintain frame is formed in a rectangular frame shape.

The vacuum peeling method may further include disposing a buffer pad at one side of the peeling prevention panel, which faces the target object.

In accordance with exemplary embodiments, the vacuum peeling apparatus and the vacuum peeling method using the same can effectively and stably peel a film using a vacuum pressure.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
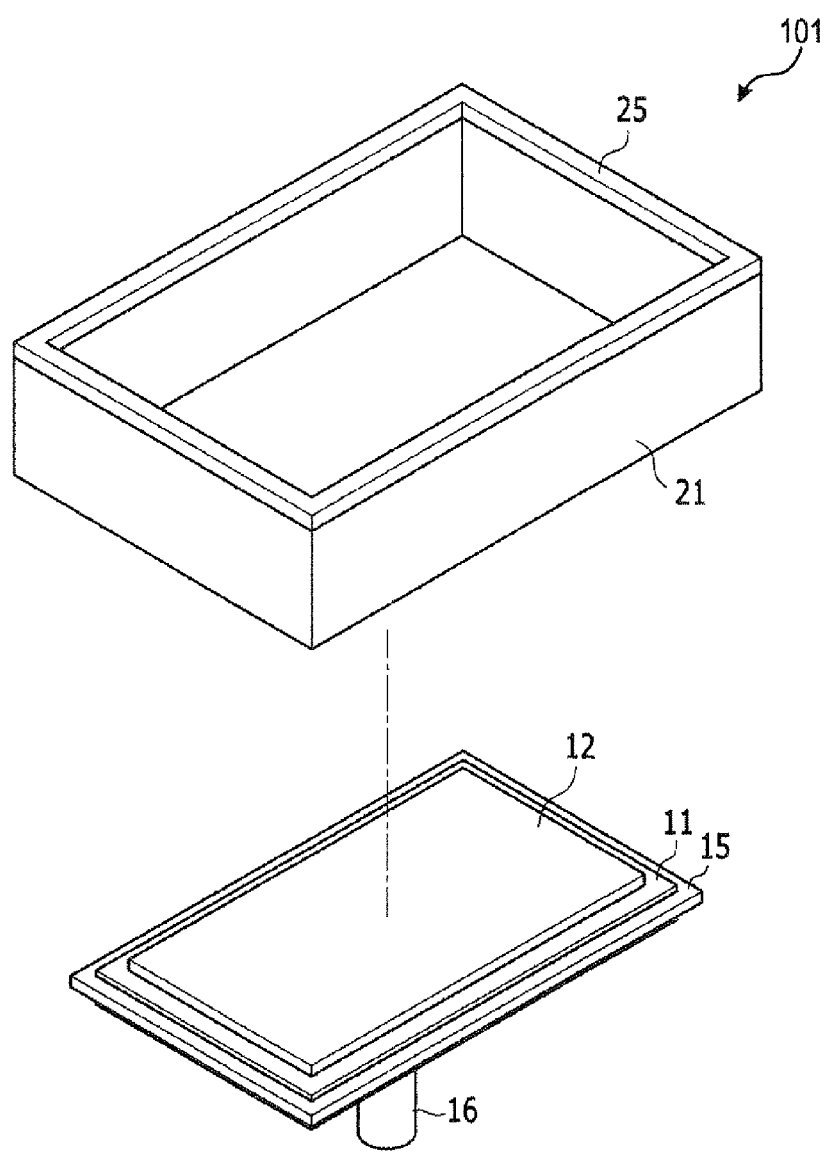
FIG. 1 is a bottom perspective view that illustrates a vacuum peeling apparatus in accordance with an exemplary embodiment of the invention.

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

Drawings may be roughly illustrated, and scales of elements may not be accurate.

In the drawings, sizes or ratios of elements may be exaggerated or reduced for clarity. However, the present invention is not limited to the sizes or ratios of elements illustrated in the drawings. Like reference numerals designate like elements throughout the specification. It will be understood that, when an element such as a layer, film, region or substrate is referred to as being "on" another element, it can be directly on the other element or intervening elements may also be present.

An exemplary embodiment of the invention may be described in detail as an ideal exemplary embodiment. As a result, the described embodiments may be modified in various different ways, all without departing from the spirit or scope of the present invention. Therefore, an exemplary embodiment is not limited to a specific form of a region illustrated in the drawings. For example, a form may be modified in various ways.

Hereinafter, a vacuum peeling apparatus in accordance with an embodiment of the invention will be described with reference to FIG. 1, FIG. 2 and FIG. 3 to FIG. 7.

Figure 2:
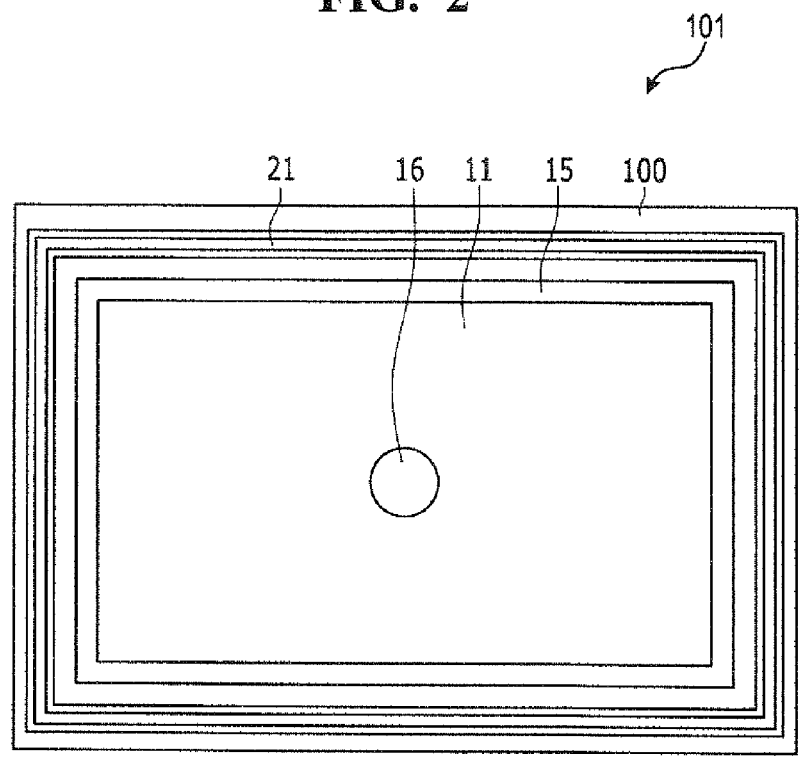
FIG. 2 is a top plan view that illustrates the vacuum peeling apparatus of FIG. 1.

FIG. 1 is a bottom perspective view that illustrates a vacuum peeling apparatus in accordance with an exemplary embodiment of the invention; FIG. 2 is a top plan view that illustrates the vacuum peeling apparatus of FIG. 1; and FIG. 3 to FIG. 7 are diagrams that sequentially illustrate a method for separating a film using the vacuum peeling apparatus of FIG. 1.

Figure 3:
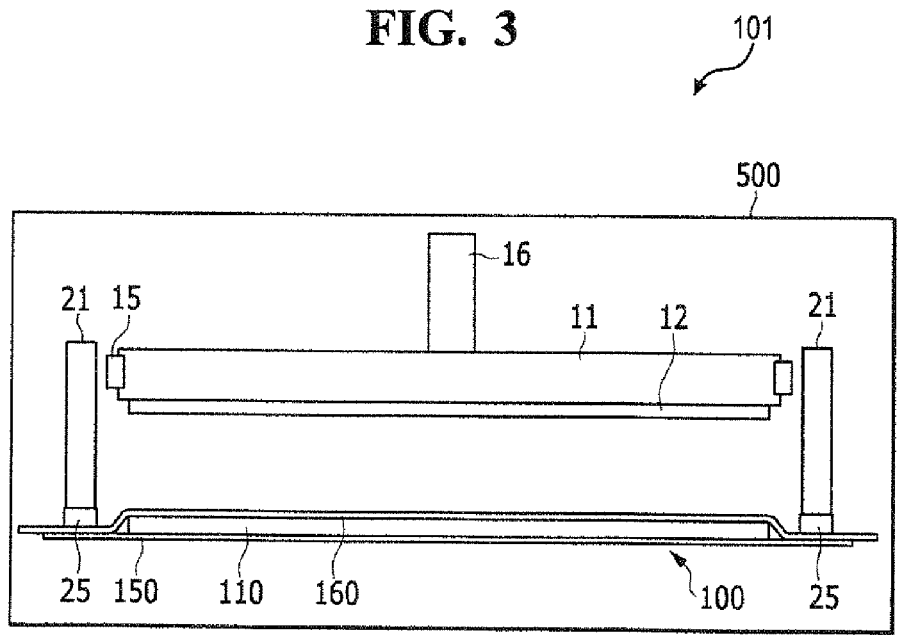
FIG. 3 to FIG. 7 are diagrams that sequentially illustrate a method for separating a film using the vacuum peeling apparatus of FIG. 1.

As shown in FIG. 1, FIG. 2 and FIG. 3, the vacuum peeling apparatus 101 according to an exemplary embodiment may include a chamber 500 (see FIG. 3), a sealing maintain frame 21 (see FIG. 1 to FIG. 3), a first air tube 25 (see FIG. 1 and FIG. 3), a peeling prevention panel 11 (see FIG. 1 to FIG. 3), and a second air tube 15 (see FIG. 1 to FIG. 3).

The vacuum peeling apparatus 101 may further include a buffer pad 12 (see FIG. 1 and FIG. 3) and a driver 16 (see FIG. 1 to FIG. 3).

In accordance with an exemplary embodiment, as shown in FIG. 3, the vacuum peeling apparatus 101 may perform a peeling process on a target object 100. The target object 100 may include a substrate 110, a first film 160, and a second film 150. The first film 160 may be disposed on a top surface of the substrate 110, and the second film 150 may be disposed on a bottom surface of the substrate 110. Edges of the first film 160 may be attached to edges of the second film 150. The vacuum peeling apparatus 101 may separate the first film 160 from the substrate 110.

The chamber 500 shown in FIG. 3 may change a state of an internal space to an atmospheric pressure state or a vacuum pressure state.

The sealing maintain frame 21 may have a rectangular frame shape. The sealing maintain frame 21 may be disposed inside the chamber 500. Bottom ends of the sealing maintain frame 21 may pressurize edges of the target object 100, as shown in FIG. 3. That is, the bottom ends of the sealing maintain frame 21 may pressurize connected parts of the first film 160 and the second film 150, and may firmly fix the connected parts of the first film 160 to the second film 150. Accordingly, the sealing maintain frame 21 may prevent the connected parts of the first film 160 and the second film 150 from being separated.

However, the present invention is not limited to the sealing maintain frame 21 having the rectangular frame shape. In another exemplary embodiment, the sealing maintain frame 21 may have a shape different from the rectangular frame shape. For example, the sealing maintain frame 21 may have a closed loop shape. Furthermore, the sealing maintain frame 21 may have any shapes that can stably pressurize and seal the edges of the target object 100.

The peeling prevention panel 11 may be inserted into a center of the sealing maintain frame 21, and may pressurize a top portion of the target object 100. The peeling prevention panel 11 may pressurize the top portion of the target object 100 in order to prevent generation of defects that may be generated when the first film 160 of the target object 100 is partially and slowly separated from the substrate 110 after the inside of the chamber 500 becomes a vacuum pressure state.

The first air tube 25 may be disposed along the bottom end of the sealing maintain frame 21. That is, the first air tube 25 may be disposed between the sealing maintain frame 21 and the edge of the target object 100. The first air tube 25 may be expandable. The first air tube 25 may be expanded or contracted according to the degree of injection of a gas or surrounding atmospheric pressure. When the first air tube 25 is expanded, the first air tube 25 may tightly contact the bottom end of the sealing maintain frame 21 and the edge of the target object 100.

The second air tube 15 may be disposed along one end of the peeling prevention panel 11. That is, when the peeling prevention panel 11 is inserted into the center of the sealing maintain frame 21, the second air tube 15 is disposed between a wall of the sealing maintain frame 21 and the end of the peeling prevention panel 11. The second air tube 15 may be expandable. The second air tube 15 may be expanded or contracted according to a degree of injection of a gas or surrounding atmospheric pressure. When the second air tube 15 becomes expanded, the second air tube 15 may tightly contact the surface of the wall of the sealing maintain frame 21 and the end of the peeling prevention panel 11.

Therefore, when the first air tube 25 and the second air tube 15 become expanded, a sealing space may be formed. The sealing space may be surrounded by the target object 100, the sealing maintain frame 21, and the peeling prevention panel 11.

The buffer pad 12 may be attached to a bottom side of the peeling prevention panel 11. That is, the buffer pad 12 may be disposed between the peeling prevention panel 11 and the target object 100. The buffer pad 12 may prevent the target object 100 from being damaged when the peeling prevention panel 11 pressurizes the top portion of the target object 100. For example, the buffer pad 12 may be made of silicon or urethane.

The driver 16 may be connected to the peeling prevention panel 11. The driver 16 may lift or lower the peeling prevention panel 11 as a result of its being inserted into the center of the sealing maintain frame 21.

The vacuum peeling apparatus 101 according to the exemplary embodiment of the invention can stably and effectively peel the film 160 from the substrate 100 using a vacuum pressure.

Hereinafter, a method for peeling a film in a vacuum pressure state using the vacuum peeling apparatus 101 according to an exemplary embodiment of the invention will be described.

As shown in FIG. 3, a target object 100 may be prepared. The target object 100 may include a substrate 110, a first film 160 and a second film 150. The first film 160 may be formed on a top surface of the substrate 110 and the second film 150 may be formed on a bottom surface of the substrate 110. The edge of the first film 160 may be attached to the edge of the second film 150.

The target object 100 may be disposed inside the chamber 500 having the atmospheric pressure state.

Using the sealing maintain frame 21 having a rectangular frame shape, the connected edges of the first film 160 and the second film 150 of the target object 100 may be pressurized.

Figure 4:
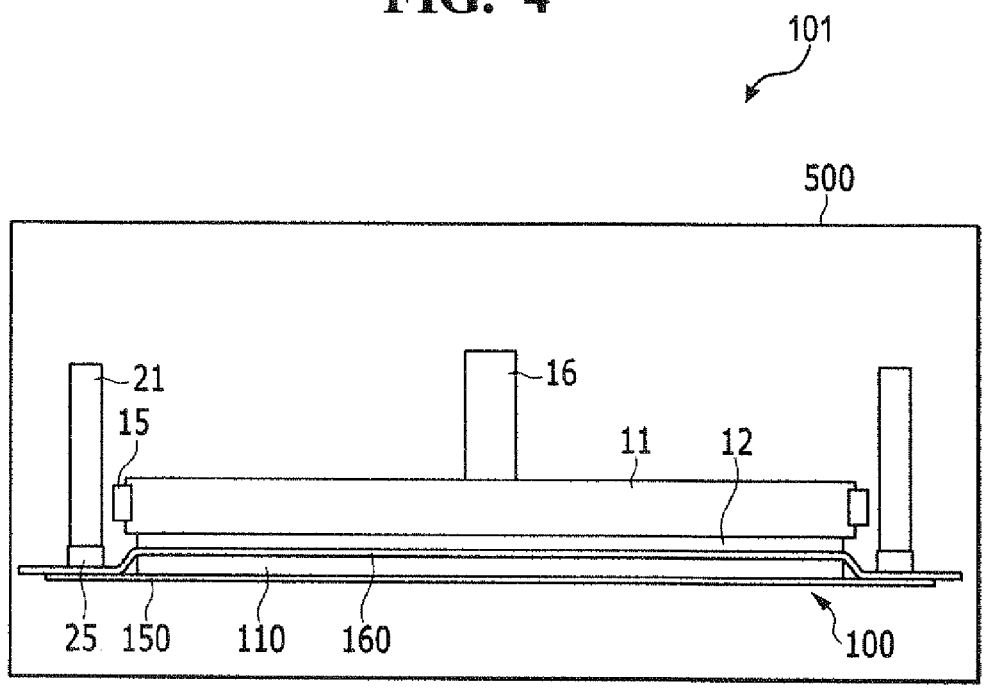

As shown in FIG. 4, the peeling prevention panel 11 may be inserted into the center of the sealing maintain frame 21, and may pressurize the first film 160 formed on the front surface of the target objection 100. The peeling prevention panel 11 may be driven by the driver 16. Furthermore, the buffer pad 12 may be disposed at one side of the peeling prevention panel 11, which faces the target object 100. Accordingly, the buffer pad 12 may prevent the target object 100 from being damaged when the peeling prevention panel 11 pressurizes the target object 100.

Figure 5:
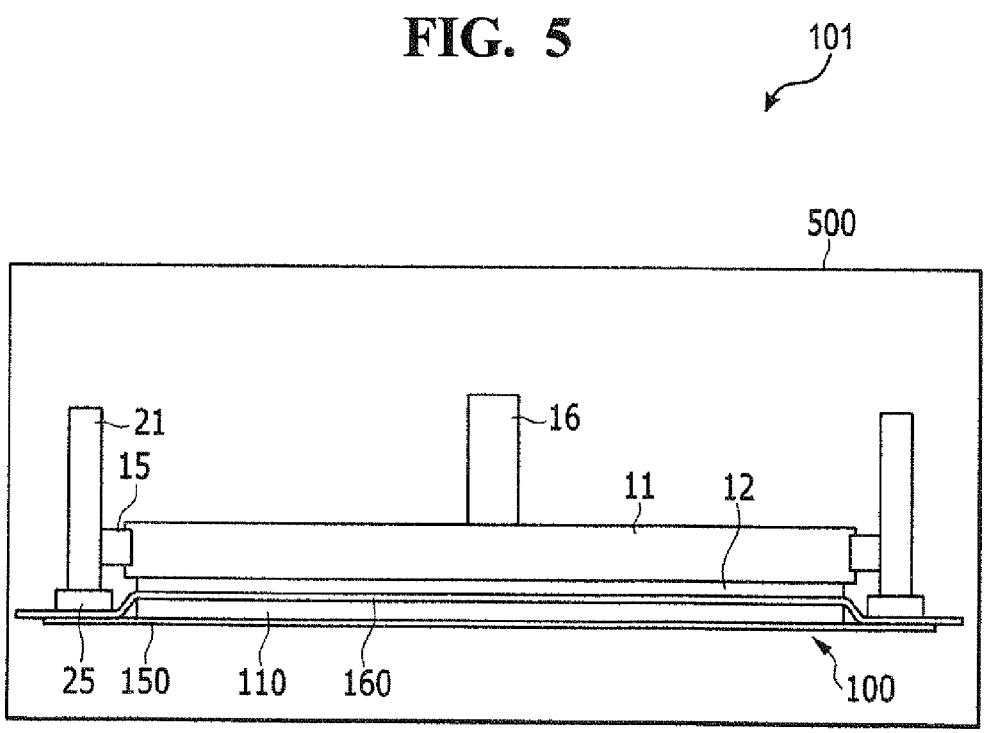

As shown in FIG. 5, a sealing space may be formed. The sealing space may be surrounded by the target object 100, the sealing maintain frame 21 and the peeling prevention panel 11.

In particular, the sealing space may be formed by the first air tube 25 and the second air tube 15. The first air tube 25 may be expandable and disposed along the bottom end of the sealing maintain frame 21, and the second air tube 15 may be expandable and disposed along ends of the peeling prevention panel 11.

When the first air tube 25 becomes expanded, the first air tube 25 may tightly contact the sealing maintain frame 21 and the target object 100. When the second air tube 15 becomes expanded, the second air tube 15 may tightly contact the peeling prevention panel 11 and the sealing maintain frame 21. As a result, the sealing space surrounded by the sealing maintain frame 21, the peeling prevention panel 11, the first air tube 25, and the second air tube 15 may be formed.

Thereafter, an inside state of the chamber 500 may be changed to a vacuum pressure state while maintaining an inside state of the sealing space at atmospheric pressure. For example, a vacuum degree of the inside of the chamber 500 may be about $1 \times 10^{-2}$ Torr higher than a vacuum degree of the sealing space.

When the chamber 500 assumes a vacuum pressure state In accordance with an exemplary embodiment of the invention, the first air tube 25 and the second air tube 15 become further expanded. As a result, the first air tube 25 may further tightly contact the target object and the sealing maintain frame 21 and the second air tube 15 may further tightly contact the peeling prevention panel 11 and the sealing maintain frame 21. Accordingly, the sealing space may be stably formed. That is, the sealing space may stably maintain the atmospheric pressure or a pressure comparatively close to the atmospheric pressure.

Meanwhile, the pressure in the sealing space may be slightly changed. Such slight pressure variation may cause the first film 160 of the target object 100 to be slowly and partially separated from the substrate 110. When the first film 160 is slowly and partially separated from the substrate 110, uniform quality cannot be obtained.

Such a defect may be prevented in an exemplary embodiment of the invention because the peeling prevention panel 11 physically pressurizes the first film 160 toward the substrate 110. Accordingly, it may prevent the first film 160 from being slowly and partially separated from the substrate 110.

Figure 6:
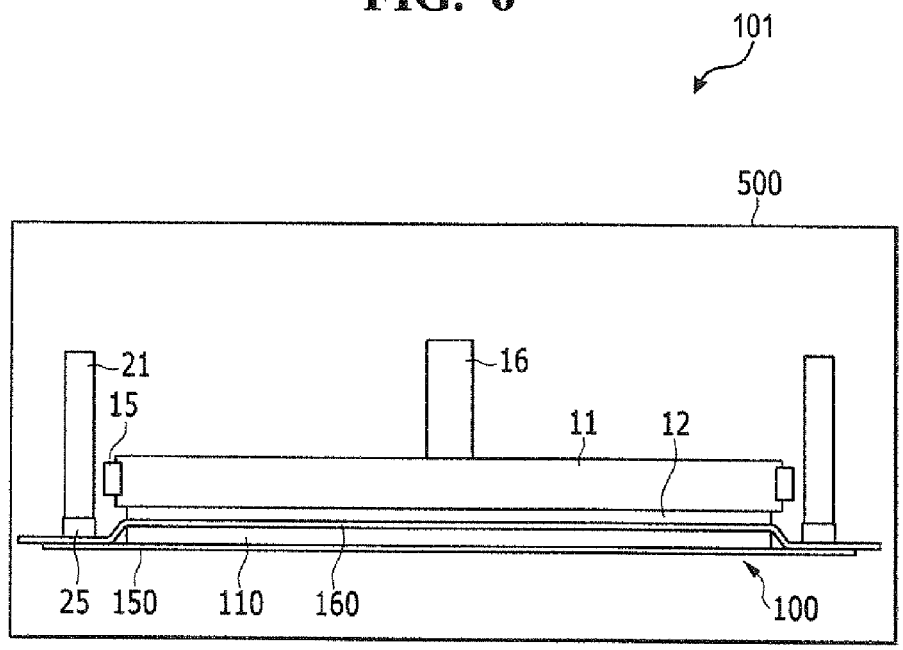

As shown in FIG. 6, the sealing space may be relieved. Particularly, the sealing space may be relieved by contracting the first air tube 25 and the second air tube 15. Accordingly, the sealing space may assumes a vacuum pressure state.

Figure 7:
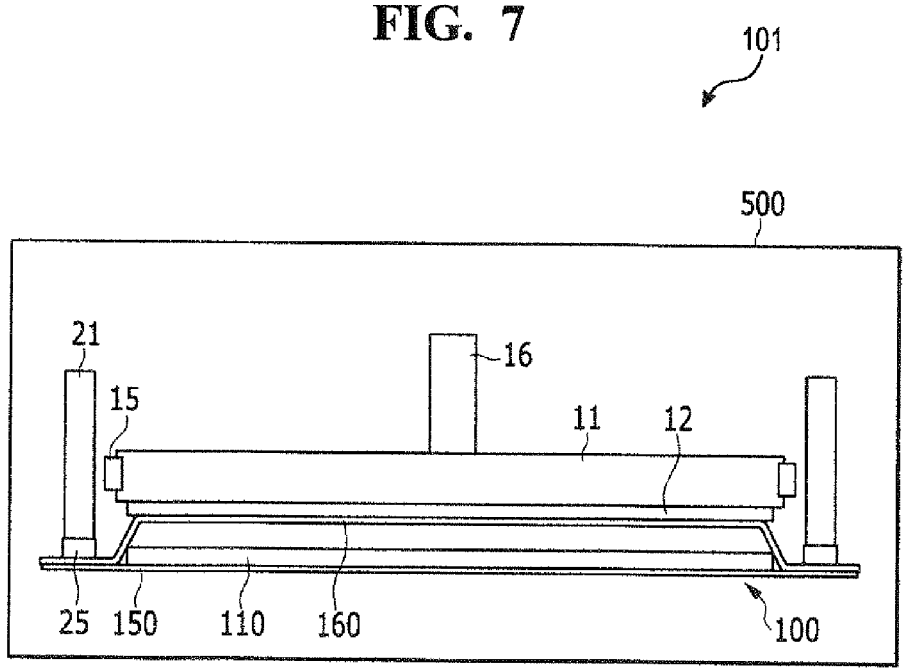

As shown in FIG. 7, the peeling prevention panel 11 may be lifted. When the peeling prevention panel 11 is lifted, a physical pressure force may be removed. Accordingly, the first film 160 may be separated from the substrate 110 due to a pressure difference between the internal pressure of the target object 100 and the inside pressure of the chamber 500, which is a vacuum pressure.

When the inside pressure of the chamber 500 is changed to the vacuum pressure without the peeling prevention panel 11 or without forming the sealing space, the inside pressure of the chamber 500 is changed slowly. Such a gradual pressure variation may cause the first film 160 to be partially and slowly separated from the substrate 110.

In accordance with an exemplary embodiment of the invention, the sealing space may be formed through the sealing maintain frame 21, the peeling prevention panel 11, the first air tube 25, and the second air tube 15. Furthermore, the target object 100 may be physically pressurized with the peeling prevention panel 11. Thereafter, the inside pressure of the chamber 500 is sufficiently changed to a target vacuum pressure. After reaching the target vacuum pressure, the sealing space may be relieved and the peeling prevention panel 11 may be lifted. Accordingly, the first film 160 of the target object may be stably separated from the substrate 110 in accordance with an exemplary embodiment of the invention. In accordance with an exemplary embodiment of the invention, it may prevent the gradual pressure variation from being influenced to a process of peeling the first film 160 off the substrate 110 while the inside pressure of the chamber 500 is changed to a vacuum pressure state.

As described above, the vacuum peeling method using the vacuum peeling apparatus 101 according to an exemplary embodiment of the invention can effectively and stably peel the film 160 off from the substrate 110 using a vacuum pressure.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A vacuum peeling method, comprising the steps of:
preparing a target object, wherein the target object includes a substrate, a first film disposed on a top surface of the substrate, and a second film disposed on a bottom surface of the substrate, and wherein an edge of the first film is connected to an edge of the second film so as to form connected edges of the first film and the second film;
disposing the target object inside a chamber having an atmospheric pressure;
pressurizing the connected edges of the first film and the second film of the target object using a sealing maintain frame;
pressurizing the first film disposed on a top surface of the target object by inserting a peeling prevention panel into the sealing maintain frame;
forming a sealing space surrounded by the target object, the sealing maintain frame, and the peeling prevention panel;
changing an inside pressure of the chamber to a vacuum pressure while maintaining an inside pressure of the sealing space at the atmospheric pressure;
changing the inside pressure of the sealing space to the vacuum pressure; and
separating the first film from the substrate while maintaining the connected edges of the first film and the second film of the target object by lifting the peeling prevention panel.

2. The vacuum peeling method of claim 1, further comprising the steps of:
disposing a first air tube along a bottom end of the sealing maintain frame, wherein the first air tube is expandable; and
disposing a second air tube along an end of the peeling prevention panel, wherein the second air tube is expandable.

3. The vacuum peeling method of claim 2, wherein the sealing space is formed by expanding the first air tube and the second air tube so as to make the first air tube contact the sealing maintain frame and the target object, and so as to make the second air tube contact the sealing maintain frame and the peeling prevention panel.

4. The vacuum peeling method of claim 2, further comprising the step of contracting the first air tube and the second air tube.

5. The vacuum peeling method of claim 1, wherein the sealing maintain frame is formed in a rectangular frame shape.

6. The vacuum peeling method of claim 1, further comprising the step of disposing a buffer pad at one side of the peeling prevention panel, said one side facing the target object.

* * * * *